(12) United States Patent
Zhang et al.

(10) Patent No.: US 12,389,768 B2
(45) Date of Patent: *Aug. 12, 2025

(54) ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhen Zhang, Beijing (CN); Tingliang Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 139 days.

This patent is subject to a terminal disclaimer.

(21) Appl. No.: 17/891,173

(22) Filed: Aug. 19, 2022

(65) Prior Publication Data

US 2022/0406821 A1    Dec. 22, 2022

Related U.S. Application Data

(63) Continuation of application No. 16/768,194, filed as application No. PCT/CN2019/127345 on Dec. 23, 2019, now Pat. No. 11,462,572.

(30) Foreign Application Priority Data

Jan. 8, 2019    (CN) .................... 201910016329.X

(51) Int. Cl.
*H10K 59/131*    (2023.01)
*H10D 86/40*    (2025.01)
(Continued)

(52) U.S. Cl.
CPC ......... *H10K 59/131* (2023.02); *H10D 86/443* (2025.01); *H10D 86/60* (2025.01); *H10K 59/124* (2023.02)

(58) Field of Classification Search
CPC ................ H10K 59/131; H10K 59/124; H01L 27/1244; H01L 27/124; H10D 86/60; H10D 86/443; H10D 86/441
See application file for complete search history.

(56) References Cited

U.S. PATENT DOCUMENTS 7,332,745 B2 *    2/2008    Kang .................... H10D 86/40
                                                                257/E27.111
9,715,304 B2    7/2017    Berget et al.
(Continued)

FOREIGN PATENT DOCUMENTS

CN    1584684 A    2/2005
CN    101510383 A    12/2011
(Continued)

OTHER PUBLICATIONS

Office action from Japanese Patent Application No. 2020-560908 dated Nov. 6, 2023.
(Continued)

*Primary Examiner* — Vongsavanh Sengdara
(74) *Attorney, Agent, or Firm* — Calfee, Halter & Griswold LLP

(57) ABSTRACT

An OLED display device, including an array substrate, wherein the array substrate including: a display area and a peripheral area, wherein a common electrode is provided in the display area and an electrode bus is provided adjacent to the display area in the peripheral area; a first electrode pad provided on a side of the peripheral area distal to the display area, wherein the first electrode pad is a cathode pad; a first conductive portion connected to the first electrode pad and the common electrode; a second electrode pad provided on (Continued)

a side of the peripheral area distal to the display area, wherein the second electrode pad is an anode pad; and a second conductive portion connected to the second electrode pad and extending, in a direction opposite to the first conductive portion, to be connected to the electrode bus.

19 Claims, 2 Drawing Sheets

(51) Int. Cl.
*H10D 86/60* (2025.01)
*H10K 59/124* (2023.01)

(56) References Cited

U.S. PATENT DOCUMENTS

| | | | |
|---|---|---|---|
| 9,893,093 | B2 | 2/2018 | Kim et al. |
| 10,347,665 | B2 | 7/2019 | Kim et al. |
| 2006/0145606 | A1* | 7/2006 | Lee ............... H10K 59/131 313/509 |
| 2015/0187279 | A1* | 7/2015 | Lee ............... H10K 59/805 438/23 |
| 2016/0145606 | A1 | 5/2016 | Chaput |
| 2016/0365398 | A1* | 12/2016 | Kim ............... H10K 59/131 |
| 2017/0003791 | A1 | 1/2017 | Berget et al. |
| 2017/0033312 | A1* | 2/2017 | Kim ............... H10K 59/873 |
| 2017/0237027 | A1 | 8/2017 | Lee et al. |
| 2017/0256599 | A1* | 9/2017 | Kim ............... H10K 77/111 |
| 2017/0287936 | A1* | 10/2017 | Kim ............... H10D 86/441 |
| 2017/0345847 | A1* | 11/2017 | Kim ............... H10K 59/131 |
| 2018/0097034 | A1 | 4/2018 | Lee et al. |
| 2018/0138207 | A1 | 5/2018 | Kim et al. |
| 2019/0288234 | A1* | 9/2019 | Kim ............... H10K 50/844 |
| 2019/0296052 | A1 | 9/2019 | Kim et al. |
| 2019/0296099 | A1* | 9/2019 | Lee ............... H10K 59/131 |
| 2021/0028398 | A1* | 1/2021 | Watanabe ...... H10K 59/8731 |

FOREIGN PATENT DOCUMENTS

| | | | | |
|---|---|---|---|---|
| CN | 103887314 A | 9/2016 | | |
| CN | 106707646 A | 5/2017 | | |
| CN | 106919287 A | 7/2017 | | |
| CN | 107078024 A | 8/2017 | | |
| CN | 107275365 A | 10/2017 | | |
| CN | 107369692 A | 11/2017 | | |
| CN | 104950537 A | 6/2018 | | |
| CN | 109742115 A | 5/2019 | | |
| CN | 106325590 A | 12/2019 | | |
| CN | 107065336 A | 5/2020 | | |
| JP | 2004102053 A | 4/2004 | | |
| JP | 2004355014 A | 12/2004 | | |
| JP | 2005250062 A | 9/2005 | | |
| JP | 2012099290 A | * 5/2012 | ............ | H01L 51/50 |
| JP | 2017215965 A | 12/2017 | | |
| JP | 2018200787 A | 12/2018 | | |
| KR | 20070080425 A | 8/2007 | | |
| KR | 20120072173 A | 7/2012 | | |
| WO | 2012070558 A1 | 5/2012 | | |
| WO | 2013186919 A1 | 12/2013 | | |

OTHER PUBLICATIONS

Office Action of JP application No. 2020-560908 dated May 20, 2024.
Notice of Allowance from U.S. Appl. No. 16/768,194 dated Jun. 2, 2022.
Office action from U.S. Appl. No. 16/769,194 dated Feb. 10, 2022.
Office action from Chinese Application No. 201910016329.X dated Jul. 2, 2020.
Allowance from Chinese Application No. 201910016329.X dated Dec. 15, 2020.
International Search Report and Written Opinion from PCT/CN2019/127345 dated Mar. 25, 2020.
Office action from European Application No. 19908209.0 dated Sep. 12, 2022.
First Office Action of EP application No. 19908209.0 dated Aug. 19, 2024.

\* cited by examiner

ARRAY SUBSTRATE AND DISPLAY DEVICE

CROSS REFERENCE OF RELATED APPLICATION

The present disclosure is a Continuation Application of U.S. application Ser. No. 16/768,194, which is a § 371 national phase application of PCT Patent Application No. PCT/CN2019/127345 filed on Dec. 23, 2019, which is based upon and claims priority to Chinese Patent Application No. 201910016329.X entitled "ARRAY SUBSTRATE AND DISPLAY DEVICE", filed on Jan. 8, 2019, the contents of which being incorporated by reference in their entireties herein.

TECHNICAL FIELD

The present disclosure generally relates to the field of display technology and, more particularly, to an array substrate and a display device.

BACKGROUND

A display panel needs to be well encapsulated to maintain the stability of internal materials thereof. For example, for an organic light-emitting diode (OLED) display panel, if the encapsulation fails, external water, oxygen, etc. will enter into a display area of the display panel, resulting in the failure of an organic light-emitting material and reducing the display quality of an OLED.

The display panel is prone to package failure on the pad side. For example, an encapsulation layer is easily peeled off at an electrode lead. The gap between the electrode lead and the encapsulation layer that is peeled off will form a path which causes erosion by water and oxygen, such that water and oxygen can enter into the display area, leading to package failure.

The above-mentioned information disclosed in this part are provided only for acquiring a better understanding of the background of the present application and therefore, may include information that is not current technology already known to those of ordinary skill in the art.

SUMMARY

The present disclosure provides an array substrate and a display device, which can reduce the risk of peel-off of an encapsulation layer and improve the yield of the encapsulation of the array substrate.

The present disclosure adopts the following technical solutions:

According to a first aspect of the present disclosure, there is provided an OLED display device, including an array substrate, wherein the array substrate including:
  a display area and a peripheral area, wherein a common electrode is provided in the display area and an electrode bus is provided adjacent to the display area in the peripheral area;
  a first electrode pad provided on a side of the peripheral area distal to the display area, wherein the first electrode pad is a cathode pad;
  a first conductive portion connected to the first electrode pad and the common electrode;
  a second electrode pad provided on a side of the peripheral area distal to the display area, wherein the second electrode pad is an anode pad; and
  a second conductive portion connected to the second electrode pad and extending, in a direction opposite to the first conductive portion, to be connected to the electrode bus.

In an exemplary embodiment of the present disclosure, the second conductive portion includes a first connection segment, a second connection segment, and a third connection segment connected in sequence;
  the first connection segment is connected to the second electrode pad and the third connection segment is connected to the electrode bus; and
  the second connection segment extends, in a direction opposite to the first conductive portion, from a connection position with the first connection segment, to be connected to the third connection segment.

In an exemplary embodiment of the present disclosure, the second connection segment extends along a linear trajectory in a direction opposite to the first conductive portion from a connection position with the first connection segment.

In an exemplary embodiment of the present disclosure, the first connection segment extends along a linear trajectory in a direction opposite to the first conductive portion from the second electrode pad.

In an exemplary embodiment of the present disclosure, an extension direction of the second connection segment is parallel to an extension direction of the electrode bus.

In an exemplary embodiment of the present disclosure, an extension direction of the third connection segment is perpendicular to an extension direction of the electrode bus.

In an exemplary embodiment of the present disclosure, a chamfer angle is provided at a connection position of the first connection segment and the second connection segment.

In an exemplary embodiment of the present disclosure, the array substrate further includes:
  a base substrate; and
  an isolation strip provided between the second electrode pad and the electrode bus,
  wherein the second electrode pad, the second conductive portion, the electrode bus, and the isolation strip are provided on a same side of the base substrate, and the isolation strip covers at least a portion of the second conductive portion.

In an exemplary embodiment of the present disclosure, the isolation strip is one of a plurality of the isolation strips spaced apart from one another.

In an exemplary embodiment of the present disclosure, a material of the isolation strip is an organic insulating material, an inorganic insulating material, or a combination of a plurality of layers of different insulating materials.

In an exemplary embodiment of the present disclosure, the first conductive portion, the second conductive portion, and the electrode bus are covered with an organic layer, and the plurality of isolation strips are open grooves in the organic layer, a portion of the organic layer remaining among the open grooves.

In an exemplary embodiment of the present disclosure, a material of the organic layer includes an organic insulating material, an inorganic insulating material, or a combination of a plurality of layers of different insulating materials.

In an exemplary embodiment of the present disclosure, at least a portion of edges of the first conductive portion and the second conductive portion are provided in a concave-convex shape.

According to a second aspect of the present disclosure, there is provided an OLED display device, including an array substrate, wherein the array substrate including:
- a display area and a peripheral area, wherein a common electrode is provided in the display area and an electrode bus is provided adjacent to the display area in the peripheral area;
- a plurality of pairs of first electrode pads and second electrode pads, wherein each pair of first electrode pad and second electrode pad are provided on a side of the peripheral area distal to the display area, the first electrode pads are cathode pads, and the second electrode pad are anode pads;
- a plurality of first conductive portions connected to the respective first electrode pads in one-to-one correspondence and the common electrode; and
- a plurality of second conductive portions connected to the respective second electrode pads in one-to-one correspondence, wherein each of the plurality of second conductive portions extends, in a direction opposite to the first conductive portion in the pair, to be connected to the electrode bus.

In an exemplary embodiment of the present disclosure, each of the plurality of second conductive portions includes a first connection segment, a second connection segment, and a third connection segment connected in sequence;
- the first connection segment is connected to the second electrode pad in the pair and the third connection segment is connected to the electrode bus; and
- the second connection segment extends, in a direction opposite to the first conductive portion in the pair, from a connection position with the first connection segment, to be connected to the third connection segment.

In an exemplary embodiment of the present disclosure, the second connection segment extends along a linear trajectory in a direction opposite to the first conductive portion in the pair from a connection position with the first connection segment.

In an exemplary embodiment of the present disclosure, the first connection segment extends along a linear trajectory in a direction opposite to the first conductive portion from the second electrode pad in the pair.

In an exemplary embodiment of the present disclosure, an extension direction of the second connection segment is parallel to an extension direction of the electrode bus.

In an exemplary embodiment of the present disclosure, an extension direction of the third connection segment is perpendicular to an extension direction of the electrode bus.

In an exemplary embodiment of the present disclosure, a chamfer angle is provided at a connection position of the first connection segment and the second connection segment.

In the array substrate and the display device provided by the present disclosure, the second conductive portion extends, in a direction opposite to the first conductive portion, to be connected to the electrode bus, so there is a relatively large distance between the first conductive portion and the second conductive portion, which facilitates heat dissipation from the first conductive portion and the second conductive portion. Not only that, there is also a large distance between two current converging positions, i.e., the connection between the first conductive portion and the common electrode and the connection between the second conductive portion and the electrode bus, which facilitates heat dissipation from the two current converging positions. Therefore, the array substrate has good heat dissipation performance at positions of the first conductive portion and the second conductive portion, and can reduce the degree of heat accumulation, and thus is not prone to high temperature. Therefore, the risk of peel-off of an encapsulation layer at the above positions can be reduced, and the yield of the array substrate can be improved.

BRIEF DESCRIPTION OF THE DRAWINGS

The above-mentioned and other features and advantages of the present disclosure will become more apparent from the detailed description of exemplary embodiments by reference to the accompanying drawings.

DETAILED DESCRIPTION

Figure 1:
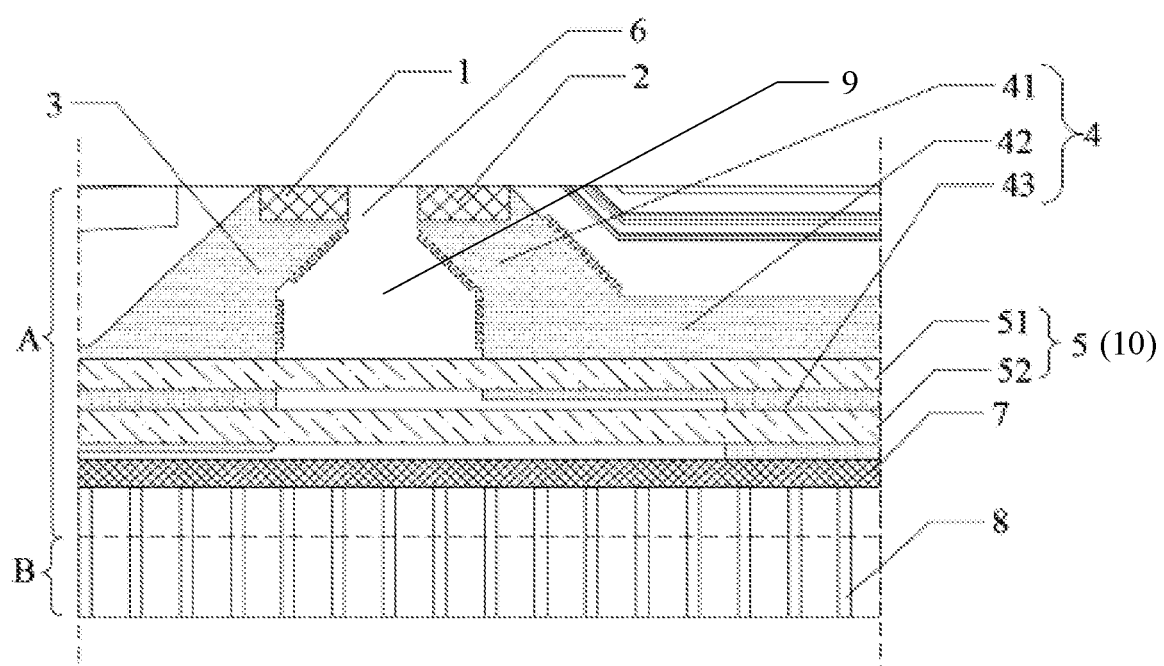
FIG. 1 is a diagram of a partial structure of an array substrate according to an embodiment of the present disclosure.

Exemplary embodiments will now be described more fully by reference to the accompanying drawings. However, the exemplary embodiments can be implemented in various forms and should not be understood as being limited to the examples set forth herein; rather, the embodiments are provided so that this disclosure will be thorough and complete, and the conception of the exemplary embodiments will be fully conveyed to those skilled in the art. Features, structures or characteristics described herein may be combined in one or more embodiments in any suitable manner. In the following description, numerous specific details are provided so as to allow a full understanding of embodiments of the present disclosure.

In the figures, thicknesses of an area and a layer may be exaggerated for the sake of clarity. The same reference signs in the drawings denote the same or similar structures and detailed description thereof will be omitted.

When a structure is "above" another structure, it probably means that the structure is integrally formed on another structure, or, the structure is "directly" disposed on another structure, or, the structure is "indirectly" disposed on another structure through an additional structure. Words such as "one", "an/a", and "the" are used herein to indicate the presence of one or more elements/component parts/and others. Terms "including" and "having" have an inclusive meaning which means that there may be additional elements, components, parts, and others in addition to the listed elements, components, parts, and others. Terms such as "first", "second", etc. are used herein only as markers, so they do not limit the number of objects modified after them.

Reference signs of main elements throughout the drawings will be described as follows: 1—first electrode pad; 2—second electrode pad; 3—first conductive portion; 4—second conductive portion; 41—first connection segment; 42—second connection segment; 43—third connection segment; 5—isolation strip; 51—first isolation strip; 52—second isolation strip; 6—base substrate; 7—electrode bus; 8—electrode lead; A—peripheral area; and B—display area.

A display panel is prone to package failure on the pad side, and is especially prone to the defect that an electrode lead and an encapsulation layer are peeled off from each other. The applicant has found that the peel-off of the encapsulation layer is related to high temperature of the peel-off area by analysis of the structure of the defective encapsulation position and analysis of temperature of various parts of the display panel during its operation, and through other tests.

In the related art, an adjacent anode pad and cathode pad are provided on the pad side in a peripheral area of a display panel. The cathode pad is connected to a common electrode through a cathode conductive portion and the anode pad is connected to an electrode bus through an anode conductive portion. The electrode bus connects electrode leads in the display area. A large amount of heat will be generated at the connection between the cathode conductive portion and the common electrode due to the convergence of cathode current, and a large amount of heat will be also generated at the connection between the anode conductive portion and the electrode bus due to the convergence of anode current. In the related art, the cathode conductive portion and the anode conductive portion extend side by side in a direction of the display area, which not only leads to a relatively short distance between the two current converging positions, but also leads to a relatively short distance between the cathode conductive portion and the anode conductive portion. Therefore, it is difficult for heat at the two current converging positions as well as heat on the cathode conductive portion and the anode conductive portion to be efficiently dissipated, which results in a high temperature at positions of the cathode conductive portion and the anode conductive portion, so the encapsulation layer is easily peeled off at high temperature.

In view of the above, an embodiment of the present disclosure provides an array substrate. As shown in FIG. 1 (the common electrode is not shown), the array substrate includes a display area B and a peripheral area A. The common electrode is provided in the display area B. An electrode bus 7 is provided adjacent to the display area B in the peripheral area A. The array substrate further includes a first electrode pad 1, a first conductive portion 3, a second electrode pad 2, and a second conductive portion 4. The first electrode pad 1 and the first conductive portion 3 are, for example, connected to a negative electrode VSS of a power supply. The second electrode pad 2 and the second conductive portion 4 are connected to a positive electrode VDD of the power supply.

The first electrode pad 1 is provided on a side of the peripheral area A distal to the display area B. The first conductive portion 3 is connected to both the first electrode pad 1 and the common electrode. The second electrode pad 2 is provided on a side of the peripheral area A distal to the display area B. The second conductive portion 4 is connected to the second electrode pad 2 and extends, in a direction opposite to the first conductive portion 3, to be connected to the electrode bus 7.

In the array substrate provided by the present disclosure, the second conductive portion 4 extends, in a direction opposite to the first conductive portion 3, to be connected to the electrode bus 7, so there is a relatively large distance between the first conductive portion 3 and the second conductive portion 4 that facilitates heat dissipation from the first conductive portion 3 and the second conductive portion 4. Not only that, there is also a large distance between two current converging positions, i.e., the connection between the first conductive portion 3 and the common electrode and the connection between the second conductive portion 4 and the electrode bus 7, which facilitates heat dissipation from the two current converging positions. Therefore, the array substrate has good heat dissipation performance at positions of the first conductive portion 3 and the second conductive portion 4, can reduce the degree of heat accumulation, and is not prone to high temperature. Therefore, the risk of peel-off of an encapsulation layer at the above positions can be reduced, thus improving the yield of the array substrate encapsulation.

Components of the array substrate provided by the embodiment of the present disclosure will be further described in detail below with reference to the drawings:

One of the first electrode pad 1 and the second electrode pad 2 may be an anode pad and the other is a cathode pad. The first electrode pad 1 and the second electrode pad 2 may be disposed adjacent to each other, for connection to an external power supply. For example, the first electrode pad 1 is connected to a negative electrode VSS of the external power supply and the second electrode pad 2 is connected to a positive electrode VDD of the external power supply.

Figure 2:
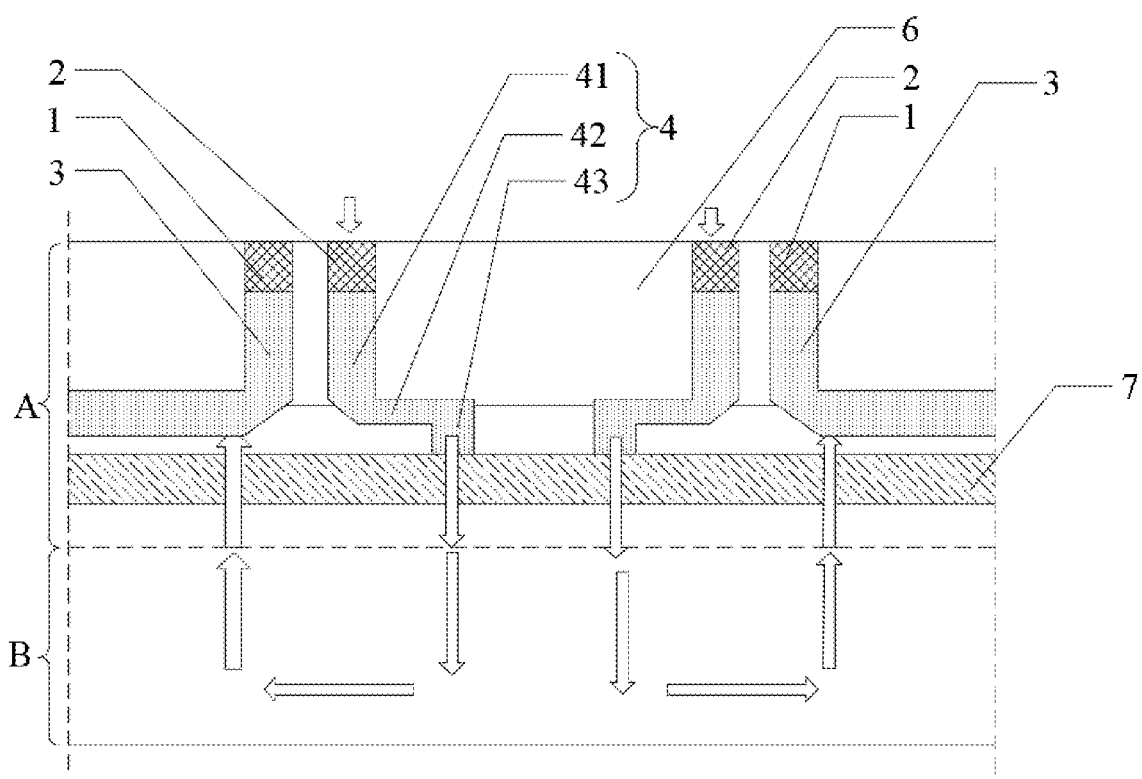
FIG. 2 is a diagram of a partial structure of an array substrate according to an embodiment of the present disclosure.

For example, in the embodiments of the present disclosure, as shown in FIGS. 1 and 2 (the common electrode is not shown), for example, the first electrode pad 1 may be a cathode pad and correspondingly the common electrode is a common cathode. The second electrode pad 2 may be an anode pad. Correspondingly, the electrode bus 7 as an anode bus is connected to the second electrode pad 2. Electrode leads 8 (as shown in FIG. 1) are provided in the display area B, each of which is connected to the electrode bus 7. The electrode leads 8 are used to connect display units. In this way, upon operating, as indicated by arrows in FIG. 2, current flows from the second electrode pad 2 to each electrode lead 8 through the second conductive portion 4 and the electrode bus 7, and flows into the common electrode after passing through the display units. The current then flows to the first electrode pad 1 from the common electrode through the first conductive portion 3.

It should be understood that a set of first electrode pad 1 and second electrode pad 2 may be provided on the array substrate, or a plurality of sets of first electrode pads 1 and second electrode pads 2 may be provided at intervals on the array substrate (as shown in FIG. 2), which is not particularly limited by the present disclosure.

The material of the first electrode pad 1 may be metal, alloy, conductive metal oxide, or other conductive materials. For example, the material of the first electrode pad 1 may be metal such as copper, tungsten, titanium, or an alloy containing any of the above-mentioned metals. The first electrode pad 1 may be in a rectangular shape, a circular shape, or other geometric shapes, which is not limited by the present disclosure.

The material and shape of the second electrode pad 2 may be the same as or different from those of the first electrode pad 1, if only to meet design requirements.

The second conductive portion 4 is connected to the second electrode pad 2 and extends, in a direction opposite to the first conductive portion 3, to be connected to the electrode bus 7. Therefore, the first conductive portion 3 and the second conductive portion 4 as a whole are flared toward the display area B. In one embodiment, both the first conductive portion 3 and the second conductive portion 4 may extend in a straight line or a smooth curve, and forms a flared shape. In another embodiment, in a direction facing toward the display area B, a distance between the first conductive portion 3 and the second conductive portion 4 may not change in at least one segment, but abruptly changes at least at one point.

The first conductive portion 3 may extend linearly to be connected to the common electrode, or may be connected to the common electrode along a polyline trajectory. In an embodiment, the first conductive portion 3 may first extend from the first electrode pad 1 to a side distal to the second electrode pad 2 in a direction oblique to the common electrode, and then extend to the common electrode, in a direction perpendicular to the common electrode, to be connected to the common electrode.

The material of the first conductive portion 3 may be metal, conductive metal oxide, or other conductive materials. For example, the material of the first conductive portion 3 may be metal such as aluminum, copper, tungsten, molybdenum, silver, or an alloy containing any of the above-mentioned metals, or may be a transparent conductive material such as indium tin oxide (ITO). The first conductive portion 3 may be formed by a layer of conductive material, or may be composed of a plurality of layers of different conductive layer materials. For example, in one embodiment, the first conductive portion 3 may be ITO.

The second conductive portion 4 may extend from the second electrode pad 2 along a bending trajectory in a direction opposite to the first conductive portion 3. The bending trajectory may be a curved trajectory or a polyline trajectory. For example, the second conductive portion 4 may include a first connection segment 41, a second connection segment 42 and a third connection segment 43 that are connected in sequence. The first connection segment 41 is connected to the second electrode pad 2 and the third connection segment 43 is connected to the electrode bus 7. The second connection segment 42 extends along a linear trajectory in a direction opposite to the first conductive portion 3 from a connection position with the first connection segment 41. The arrangement of the second connection segment 42 ensures that the third connection segment 43 is distal to the first conductive portion 3, and particularly ensures that a connection position of the third connection segment 43 with the electrode bus 7 is distal to the first conductive portion 3, so that the influence of the first conductive portion 3 on the heat dissipation of the second conductive portion 4 is reduced, ensuring the improvement of the heat dissipation efficiency of the second conductive portion 4.

In one embodiment, the first connection segment 41 extends along a linear trajectory in a direction opposite to the first conductive portion 3 from the second electrode pad 2. In this way, the distance between the first conductive portion 3 and the second conductive portion 4 is increased as much as possible as positions of the first electrode pad 1 and the second electrode pad 2 are kept unchanged, thus reducing the possibility of heat accumulation. In another embodiment, the first connection segment 41 may also extend to the display area B in a direction perpendicular to the electrode bus 7 from the second electrode pad 2.

In one embodiment, an extension direction of the second connection segment 42 is parallel to an extension direction of the electrode bus 7, which not only makes the second conductive portion 4 further distal to the first conductive portion 3, but also reduces the difficulty in the manufacturing of a mask plate of the second conductive portion 4.

In an embodiment, a chamfer angle may be provided at a connection position of the first connection segment 41 and the second connection segment 42, so that tip discharge at the connection position can be suppressed. The chamfer angle may be a rounded corner to further eliminate the tip, thus improving the effect of suppressing the tip discharge.

In one embodiment, an extension direction of the third connection segment 43 may be perpendicular to an extension direction of the electrode bus 7. In this way, the uniformity that the third connection segment 43 converges the current on the electrode bus 7 can be improved, and the differences in current distribution on the third connection segment 43 due to different connection angles of the third connection segment with the two sides of the electrode bus 7 can be reduced, thus reducing the influence of skin effect and tip effect.

The material and the number of layers of the second conductive portion 4 may be the same as or different from those of the first conductive portion 3. For example, in one embodiment, the first conductive portion 3 may be a three-layer composite material of a molybdenum layer/an aluminum layer/a molybdenum layer.

In order to reduce the possibility of defective encapsulation as much as possible, all or a part of edges of the first conductive portion 3 and the second conductive portion 4 may further be provided in a concave-convex shape, as indicated by zigzag concave and convex lines in FIG. 1, so as to increase the length of a path along which water and oxygen may enter, reduce the amount of water and oxygen entering the display area B, and reduce the risk of producing black spots and other undesirable effects due to the water and oxygen entering the display area B.

The array substrate may further isolate water and oxygen by providing an isolation strip 5. For example, the array substrate may include a base substrate 6 and an isolation strip 5, wherein the isolation strip 5 is provided between the second electrode pad 2 and the electrode bus 7. The second electrode pad 2, the second conductive portion 4, the electrode bus 7 and the isolation strip 5 are disposed on the same side of the base substrate 6. The isolation strip 5 covers at least a portion of the second conductive portion 4. That is, the isolation strip 5 is disposed on a side of the second conductive portion 4 distal to the base substrate 6. An encapsulation layer is provided on a side of the second electrode pad 2, the second conductive portion 4 and the electrode bus 7 distal to the base substrate 6. If the encapsulation layer is peeled off from the second conductive portion 4, the isolation strip 5 can block water and oxygen from entering into the display area B via a gap between the second conductive portion 4 and the encapsulation layer, reducing the risk of causing black spots in the display area B due to poor encapsulation of the display area.

The material of the isolation strip 5 may be an organic insulating material, an inorganic insulating material, or other insulating materials, or a combination of a plurality of layers of different insulating materials. In one embodiment, the material of the isolation strip 5 may be resin.

In one embodiment, the isolation strip 5 may also extend between the first electrode pad 1 and the common electrode, to cover at least a part of the first conductive portion 3. In another embodiment, the isolation strip 5 extends in a direction parallel to the electrode bus 7, and covers the first conductive portion 3 and the second conductive portion 4 in its extension direction.

In one embodiment, a plurality of isolation strips 5 are provided spaced apart from one another. For example, there are two isolation strips 5, including a first isolation strip 51 and a second isolation strip 52 that are parallel to each other. The first isolation strip 51 is provided between the electrode bus 7 and the second electrode pad 2. The second isolation strip 52 is provided between the electrode bus 7 and the first isolation strip 51. The first isolation strip 51 covers at least a part of the second connection segment 42 and the second isolation strip 52 covers at least a part of the third connection segment 43. In this way, a multiple block of water and oxygen can be realized by the isolation strips 5 to prevent water and oxygen from entering into the display area B to cause defects such as black spots in the display area B due to poor encapsulation.

In one embodiment, the first conductive portion 3, the second conductive portion 4 and the electrode bus 7 are covered with an organic layer. The above-mentioned first isolation strip 51 and second isolation strip 52 are two open grooves in the organic layer and a portion of the organic layer remains between the two open grooves, thus water and oxygen are blocked by such structure. The number of the open grooves may be more than two. The material of the organic layer may contain an organic insulating material, an inorganic insulating material, or other insulating materials, or a combination of a plurality of layers of different insulating materials. In one embodiment, the material of the organic layer may be resin.

In one embodiment, the encapsulation layer of the array substrate may be an organic insulating material or an inorganic insulating material, so as to realize the encapsulation and protection of the first conductive portion 3 and the second conductive portion 4. It can be understood that the encapsulation layer may be a layer of encapsulation material or a plurality of layers of different encapsulation materials. For example, in one embodiment, the material of the encapsulation layer may be an insulating material such as silicon nitride formed by Chemical Vapor Deposition (CVD). The encapsulation layer covers the first conductive portion 3, the second conductive portion 4, the isolation strip 5, the first isolation strip 51 and the second isolation strip 52, etc.

The present disclosure also provides a display device including the array substrate according to any of the above-described embodiments of the array substrate. The display device may be an Active Matrix Organic Light Emitting Diode (AMOLED) display panel, a Passive Matrix Organic Electrically Excited Photodiode (PMOLED) display panel, or other types of display panels, which are not particularly limited by the present disclosure.

The array substrate used in the display device in the embodiments of the present disclosure is the same as that in the embodiments of the above-described array substrate, and thus has the same beneficial effects, which will not be elaborated here.

It should be understood that the application of the present disclosure is not limit to the detailed structure and arrangement of components provided in this specification. The present disclosure can have other embodiments, and can be implemented and carried out in various ways. The aforementioned variations and modifications fall within the scope of the present disclosure. It should be understood that the disclosure disclosed and defined in this specification may extend to all alternative combinations of two or more individual features that are apparent or mentioned in the text and/or drawings. All of the different combinations form various alternative aspects of the present disclosure. Embodiments described in this specification illustrate the best modes known for carrying out the present disclosure, and will allow those skilled in the art to make use of the present disclosure.

What is claimed is:

1. An OLED display device, comprising an array substrate, wherein the array substrate comprising:
    a display area and a peripheral area, wherein a common electrode is provided in the display area and an electrode bus is provided adjacent to the display area in the peripheral area;
    a first electrode pad provided on a side of the peripheral area distal to the display area, wherein the first electrode pad is a cathode pad;
    a first conductive portion connected to the first electrode pad and the common electrode, wherein the first conductive portion is connected to the common electrode at a first connection;
    a second electrode pad provided on a side of the peripheral area distal to the display area, wherein the second electrode pad is an anode pad; and
    a second conductive portion connected to the second electrode pad and the electrode bus, and extending, in a direction opposite to the first conductive portion, from the second electrode pad to the electrode bus, wherein the second conductive portion is connected to the electrode bus at a second connection;
    wherein at least a portion of edges of the first conductive portion and the second conductive portion are provided in a concave-convex shape; and
    wherein a distance between the first connection and the second connection is greater than a distance between the first electrode pad and the second electrode pad.

2. The OLED display device according to claim 1, wherein:
    the second conductive portion comprises a first connection segment, a second connection segment, and a third connection segment connected in sequence;
    the first connection segment is connected to the second electrode pad and the third connection segment is connected to the electrode bus; and
    the second connection segment extends, in a direction opposite to the first conductive portion, from a connection position with the first connection segment, to be connected to the third connection segment.

3. The OLED display device according to claim 2, wherein:
    the second connection segment extends along a linear trajectory in a direction opposite to the first conductive portion from a connection position with the first connection segment.

4. The OLED display device according to claim 2, wherein the first connection segment extends along a linear trajectory in a direction opposite to the first conductive portion from the second electrode pad.

5. The OLED display device according to claim 2, wherein an extension direction of the second connection segment is parallel to an extension direction of the electrode bus.

6. The OLED display device according to claim 2, wherein an extension direction of the third connection segment is perpendicular to an extension direction of the electrode bus.

7. The OLED display device according to claim 2, wherein a chamfer angle is provided at a connection position of the first connection segment and the second connection segment.

8. The OLED display device according to claim 1, wherein the array substrate further comprises:
    a base substrate; and
    an isolation strip provided between the second electrode pad and the electrode bus,
    wherein the second electrode pad, the second conductive portion, the electrode bus, and the isolation strip are provided on a same side of the base substrate, and the isolation strip covers at least a portion of the second conductive portion.

9. The OLED display device according to claim 8, wherein the isolation strip is one of a plurality of the isolation strips spaced apart from one another.

10. The OLED display device according to claim 9, wherein the first conductive portion, the second conductive portion, and the electrode bus are covered with an organic layer, and the plurality of isolation strips are open grooves in the organic layer, a portion of the organic layer remaining among the open grooves.

11. The OLED display device according to claim 10, wherein a material of the organic layer comprises an organic insulating material, an inorganic insulating material, or a combination of a plurality of layers of different insulating materials.

12. The OLED display device according to claim 8, wherein a material of the isolation strip is an organic insulating material, an inorganic insulating material, or a combination of a plurality of layers of different insulating materials.

13. An OLED display device, comprising an array substrate, wherein the array substrate comprising:
- a display area and a peripheral area, wherein a common electrode is provided in the display area and an electrode bus is provided adjacent to the display area in the peripheral area;
- a plurality of pairs of first electrode pads and second electrode pads, wherein each pair of first electrode pad and second electrode pad are provided on a side of the peripheral area distal to the display area, the first electrode pads are cathode pads, and the second electrode pad are anode pads;
- a plurality of first conductive portions connected to the respective first electrode pads in one-to-one correspondence and the common electrode, wherein the plurality of first conductive portions are connected to the common electrode at a plurality of first connections; and
- a plurality of second conductive portions connected to the respective second electrode pads in one-to-one correspondence and the electrode bus, wherein each of the plurality of second conductive portions extends, in a direction opposite to the first conductive portion in the pair, from the respective second electrode pad to the electrode bus, wherein the plurality of second conductive portions are connected to the electrode bus at a plurality of second connections;
- wherein at least a portion of edges of the plurality of first conductive portions and the plurality of second conductive portions are provided in a concave-convex shape; and
- wherein a distance between a first connection and a second connection in the pair out of the plurality of first connections and second connections is greater than a distance between the respective first electrode pad and second electrode pad.

14. The OLED display device according to claim 13, wherein:
- each of the plurality of second conductive portions comprises a first connection segment, a second connection segment, and a third connection segment connected in sequence;
- the first connection segment is connected to the second electrode pad in the pair and the third connection segment is connected to the electrode bus; and
- the second connection segment extends, in a direction opposite to the first conductive portion in the pair, from a connection position with the first connection segment, to be connected to the third connection segment.

15. The OLED display device according to claim 14, wherein:
- the second connection segment extends along a linear trajectory in a direction opposite to the first conductive portion in the pair from a connection position with the first connection segment.

16. The OLED display device according to claim 14, wherein the first connection segment extends along a linear trajectory in a direction opposite to the first conductive portion from the second electrode pad in the pair.

17. The OLED display device according to claim 14, wherein an extension direction of the second connection segment is parallel to an extension direction of the electrode bus.

18. The OLED display device according to claim 14, wherein an extension direction of the third connection segment is perpendicular to an extension direction of the electrode bus.

19. The OLED display device according to claim 14, wherein a chamfer angle is provided at a connection position of the first connection segment and the second connection segment.

* * * * *